(12) United States Patent  (10) Patent No.: US 9,287,109 B2
Huisinga et al.  (45) Date of Patent: Mar. 15, 2016

(54) METHODS OF FORMING A PROTECTION LAYER TO PROTECT A METAL HARD MASK LAYER DURING LITHOGRAPHY REWORKING PROCESSES

(71) Applicant: GLOBALFOUNDRIES Inc., Grand Cayman, KY (US)

(72) Inventors: Torsten Huisinga, Dresden (DE); Keith Donegan, Dresden (DE); Robert Seidel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 104 days.

(21) Appl. No.: 13/798,764

(22) Filed: Mar. 13, 2013

(65) Prior Publication Data

US 2014/0264758 A1    Sep. 18, 2014

(51) Int. Cl.
*H01L 21/308* (2006.01)
*H01L 21/02* (2006.01)
*H01L 21/311* (2006.01)

(52) U.S. Cl.
CPC .... *H01L 21/02079* (2013.01); *H01L 21/31133* (2013.01); *H01L 21/31138* (2013.01); *H01L 21/31144* (2013.01)

(58) Field of Classification Search
CPC ............. G03F 9/7084; H01L 21/0337; H01L 21/76811
USPC ........................................... 438/734; 138/734
See application file for complete search history.

(56) References Cited

U.S. PATENT DOCUMENTS

| | | | |
|---|---|---|---|
| 8,119,531 B1* | 2/2012 | Arnold et al. ................. | 438/702 |
| 2007/0095787 A1* | 5/2007 | Mezzapelle ..................... | 216/58 |
| 2010/0040982 A1* | 2/2010 | Liu et al. ....................... | 430/314 |
| 2012/0282779 A1* | 11/2012 | Arnold et al. ................. | 438/703 |
| 2013/0216776 A1* | 8/2013 | Arnold et al. ................. | 428/141 |

* cited by examiner

*Primary Examiner* — Thomas L Dickey
(74) *Attorney, Agent, or Firm* — Amerson Law Firm, PLLC

(57) ABSTRACT

One method disclosed herein includes forming a layer of insulating material above a semiconductor substrate, forming a hard mask layer comprised of a metal-containing material above the layer of insulating material, forming a blanket protection layer on the hard mask layer, forming a masking layer above the protection layer, performing at least one etching process on the masking layer to form a patterned masking layer having an opening that stops on and exposes a portion of the blanket protection layer, confirming that the patterned masking layer is properly positioned relative to at least one underlying structure or layer and, after confirming that the patterned masking layer is properly positioned, performing at least one etching process through the patterned masking layer to pattern at least the blanket protection layer.

20 Claims, 3 Drawing Sheets

METHODS OF FORMING A PROTECTION LAYER TO PROTECT A METAL HARD MASK LAYER DURING LITHOGRAPHY REWORKING PROCESSES

BACKGROUND OF THE INVENTION

1. Field of the Invention

The present disclosure generally relates to the fabrication of integrated circuits, and, more particularly, to various methods of forming a blanket protection layer to protect a metal hard mask layer during lithography reworking processes.

2. Description of the Related Art

In modern integrated circuits, such as microprocessors, storage devices and the like, a very large number of circuit elements, especially transistors, are provided and operated on a restricted chip area. Immense progress has been made over recent decades with respect to increased performance and reduced feature sizes of circuit elements, such as transistors. However, the ongoing demand for enhanced functionality of electronic devices forces semiconductor manufacturers to steadily reduce the dimensions of the circuit elements and to increase the operating speed of the circuit elements. The continuing scaling of feature sizes, however, involves great efforts in redesigning process techniques and developing new process strategies and tools so as to comply with new design rules. Generally, in complex circuitry including complex logic portions, MOS technology is presently a preferred manufacturing technique in view of device performance and/or power consumption and/or cost efficiency. In integrated circuits including logic portions fabricated by MOS technology, field effect transistors (FETs) are provided that are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

In general, the formation of integrated circuit products involves performing a detailed sequence, i.e., a detailed process flow, of many different process operations, such as, for example, deposition processes, etching processes, ion implantation processes, chemical mechanical polishing (CMP) processes, photolithography processes, heating processes, etc., to manufacture the device. Such process operations are performed, more or less, on a layer-by-layer basis until the device is completed. As indicated, photolithography is one of the basic processes used in manufacturing integrated circuit products. A typical photolithography process generally involves the steps of: (1) applying a layer of photoresist above a wafer, typically accomplished by a spin-coating process; (2) pre-baking (or soft-baking) the layer of photoresist at a temperature of approximately 90-120° C. to reduce the level of solvents in the layer of photoresist and to improve the adhesion characteristics of the photoresist; (3) performing an exposure process, wherein a so-called "stepper tool" is used to project a pattern defined in a reticle onto the layer of photoresist to thereby create a latent image of the reticle pattern in the layer of photoresist; (4) performing a post-exposure bake process on the layer of photoresist at a temperature approximately 5-15° C. higher than the pre-bake process; (5) performing a so-called "develop" process to turn the latent image in the layer of photoresist into the final resist image; and (6) performing a post-bake process (or hard-bake) at a temperature of approximately 125-160° C. to remove residual solids and to improve adhesion of the patterned photoresist mask layer. These process steps are well known to those skilled in the art and, thus, will not be described herein in any greater detail. Various process operations, such as etching or ion implantation processes, may then be performed on an underlying layer of material or substrate through the patterned photoresist mask layer.

However, as noted above, in recent years, device dimensions and pitches have been reduced in size to the point where existing photolithography tools, e.g., 193 nm wavelength photolithography tools, have difficulty forming such features to the desired degree of accuracy. Accordingly, device designers have resorted to techniques that involve performing multiple exposures to define a single target pattern in a layer of material. One such technique is generally referred to as double patterning or double patterning technology (DPT). In general, double patterning is an exposure method that involves splitting (i.e., dividing or separating) a dense overall target circuit pattern into two separate, less-dense patterns. The simplified, less-dense patterns are then printed separately utilizing two separate masks (where one of the masks is utilized to image one of the less-dense patterns, and the other mask is utilized to image the other less-dense pattern). Further, in some cases, the second pattern is printed in between the lines of the first pattern such that the imaged wafer has, for example, a feature pitch which is half that found on either of the two less-dense masks. This technique effectively enables the printing of even smaller features than would otherwise be possible using a single mask using existing photolithography tools. There are several double patterning techniques employed by semiconductor manufacturers. From the foregoing, it should be clear that lithography operations must be performed very precisely to form modern integrated circuit products, as even small errors can result in integrated circuit products or transistors that do not function as intended and/or, in a worst-case situation, are completely inoperative.

FIGS. 1A-1D depict one illustrative prior art masking system that may be employed in manufacturing a variety of different features on an integrated circuit product 10. As shown therein, the product 10 is comprised of a layer of insulating material 12, a hard mask layer 14 comprised of a metal (e.g., TiN having a thickness of about 15 nm) or a metal-containing alloy, an optical planarization layer (OPL) 16, a so-called anti-reflective coating (ARC) layer 18 and a patterned photoresist mask layer 20 having a plurality of openings 22 defined therein. FIG. 2B depicts the product after a plurality of etching processes have been performed that stops on the hard mask layer 14. In general, at this point, the patterned layers 16, 18 and 20 represent one embodiment of a patterned etch mask 21 that will be used to pattern the underlying hard mask layer 14. Given the importance of accuracy in forming integrated circuit products, after the patterned etch mask 21 is initially formed and the hard mask layer 14 is exposed, the accuracy of the position and location of the patterned etch mask 21 relative to underlying layers or structures is checked. In the event that it is misaligned, i.e., not correctly positioned in terms of the location of the openings 22 relative to various other underlying layers, structures or markers on the product, the patterned etch mask 21 must be "reworked", i.e., it must be completely removed and the process must start all over again to form a properly positioned patterned etch mask 21 before etching through the hard mask layer 14. In practice, after it has been confirmed that a correctly positioned and located patterned etch mask 21 has been formed above the hard mask layer 14, the hard mask layer 14 is patterned by performing an etching process through the properly positioned patterned etch mask 21. Thereafter, the patterned etch mask 21 will be stripped and an opening or trench (not shown) will be formed by performing an etching process through the patterned hard mask layer 14.

FIG. 1C depicts the product 10 after the illustrative patterned etch mask 21 has been removed. In the depicted example, removing the patterned etch mask 21 would typically involve (1) performing a plasma-based ashing process to remove the patterned photoresist mask layer 20; (2) performing a wet cleaning process using, for example, a dilute hydrofluoric acid (DHF) to strip the ARC layer 18; (3) performing another plasma-based process (using $N_2$ and $H_2$) to remove the OPL layer 16; and (4) performing a water rinse process in an attempt to remove residual materials from above the surface of the hard mask layer 14. Unfortunately, as depicted in FIG. 1C, the above-described process operations performed to remove the patterned etch mask 21 results in defects 17 in or on the surface of the hard mask layer 14. In some cases, the defects 17 may be residual portions of the OPL layer 16 positioned on the surface of the hard mask layer 14. In other cases, the defects 17 may be actual defects, e.g., gouges, etc., formed in the surface of the hard mask layer 14. The number, size and location of such defects 17 may vary depending upon the particular application.

FIG. 1D provides an illustrative example of the problems that may result from the presence of such defects 17. More specifically, FIG. 1D depicts the device 10 after another or "reworked" patterned etch mask 21A has been formed above the hard mask layer 14. The reworked patterned etch mask 21A is comprised of an optical planarization layer 16A, an ARC layer 18A and a patterned photoresist mask layer 20A having a plurality of openings 22A defined therein. In this example, the reworked patterned etch mask 21A has been formed such that it is correctly positioned on the product 10. However, the presence of the defects 17 within the openings 22A causes the patterning of the hard mask layer 14 to be less accurate than desirable and may result in the transfer of the pattern defined by the reworked patterned etch mask 21A to the hard mask layer 14 being incomplete. As a result, the formation of the features in the layer of insulating material 12 may also suffer from such inaccuracies. Moreover, there are a limited number of times that the hard mask layer 14 may be subjected to such reworking processes, e.g., 3-4 times, depending upon the application, without the hard mask layer 14 becoming so degraded that it is no longer useful for its intended purpose.

The present disclosure is directed to various methods of forming a blanket protection layer to protect a metal hard mask layer during lithography reworking processes that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a protection layer to protect a metal hard mask layer during lithography reworking processes. One method disclosed herein includes forming a layer of insulating material above a semiconductor substrate, forming a hard mask layer comprised of a metal-containing material above the layer of insulating material, forming a blanket protection layer on the hard mask layer, forming a masking layer above the protection layer, performing at least one etching process on the masking layer to form a patterned masking layer having an opening that stops on and exposes a portion of the blanket protection layer, confirming that the patterned masking layer is properly positioned relative to at least one underlying structure or layer and, after confirming that the patterned masking layer is properly positioned, performing at least one etching process through the patterned masking layer to pattern at least the blanket protection layer.

A further illustrative method disclosed herein includes forming a layer of insulating material above a semiconductor substrate, forming a hard mask layer comprised of a metal-containing material above the layer of insulating material, forming a blanket protection layer on the hard mask layer, forming a first masking layer above the blanket protection layer and performing at least one first etching process on the first masking layer to form a first patterned masking layer having an opening that stops on and exposes a portion of the blanket protection layer. In this example, the method includes the additional steps of removing the first patterned masking layer with the blanket protection layer in place on the hard mask, forming a second masking layer above the blanket protection layer, performing at least one second etching process on the second masking layer to form a second patterned masking layer having an opening that stops on and exposes a portion of the blanket protection layer, confirming that the second patterned masking layer is properly positioned relative to at least one underlying structure or layer and, after confirming that the second patterned masking layer is properly positioned, performing at least one etching process through the second patterned masking layer to pattern at least the blanket protection layer.

One illustrative example of a novel device disclosed herein includes a layer of insulating material positioned above a semiconductor substrate, a hard mask layer comprised of a metal-containing material positioned on the layer of insulating material, a blanket protection layer positioned on the hard mask layer and a patterned masking layer positioned on the blanket protection layer, wherein the patterned mask layer has an opening that exposes a portion of the blanket protection layer.

BRIEF DESCRIPTION OF THE DRAWINGS

The disclosure may be understood by reference to the following description taken in conjunction with the accompanying drawings, in which like reference numerals identify like elements, and in which.

Figure 1A:
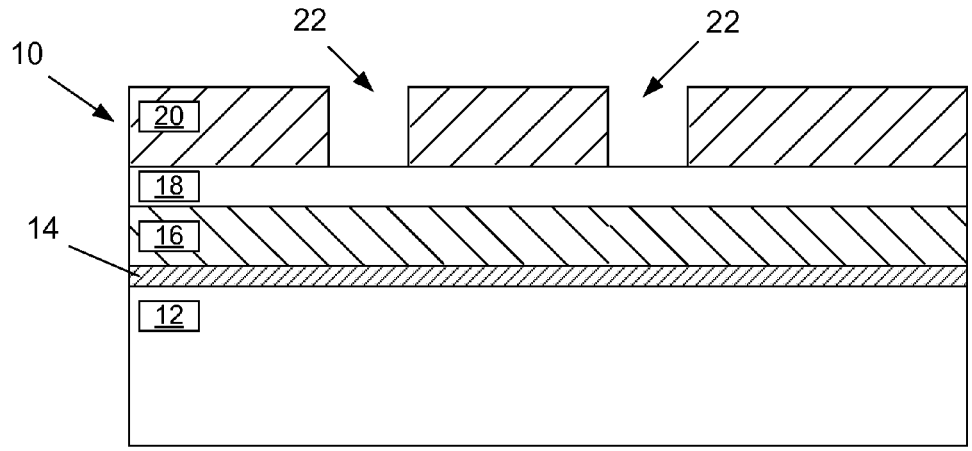
FIGS. 1A-1D schematically depict one illustrative masking system employed in forming integrated circuit products.
Figure 1B:
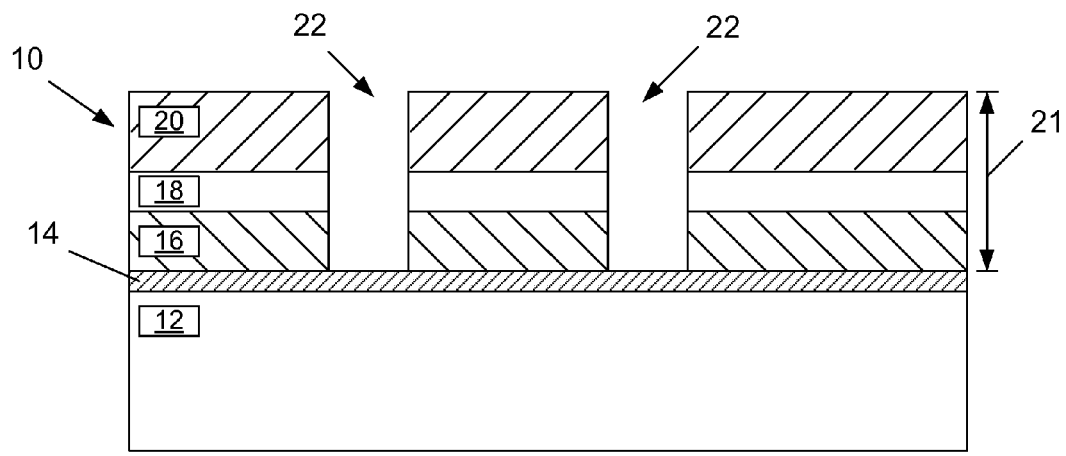
Figure 1C:
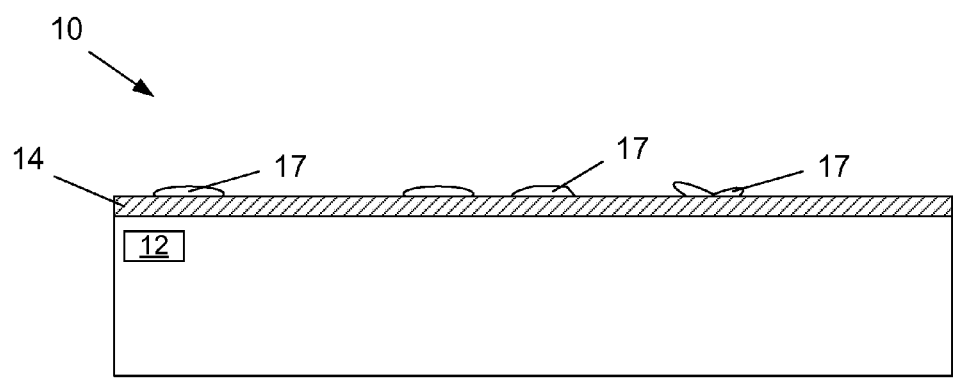
Figure 1D:
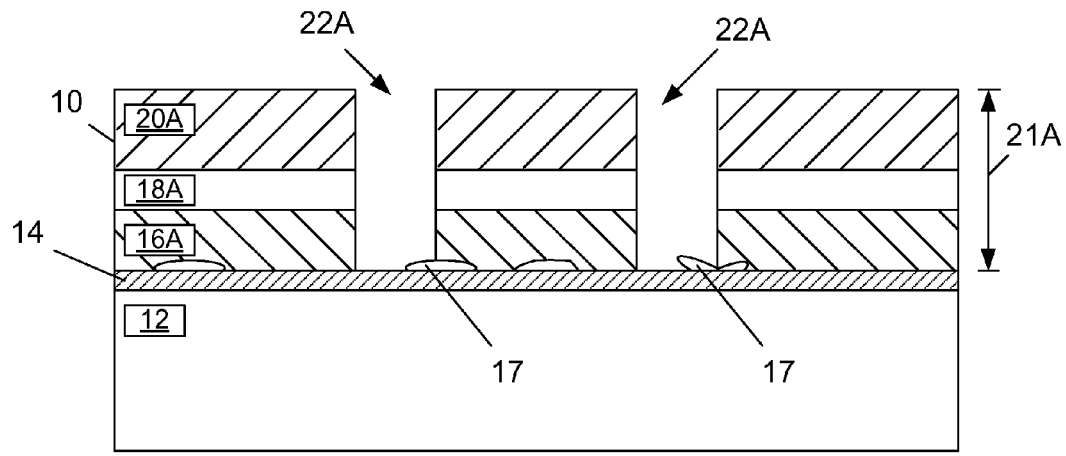

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to methods of forming a blanket protection layer to protect a metal hard mask layer during lithography reworking processes. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. With reference to the attached figures, various illustrative embodiments of the methods and devices disclosed herein will now be described in more detail.

Figure 2A:
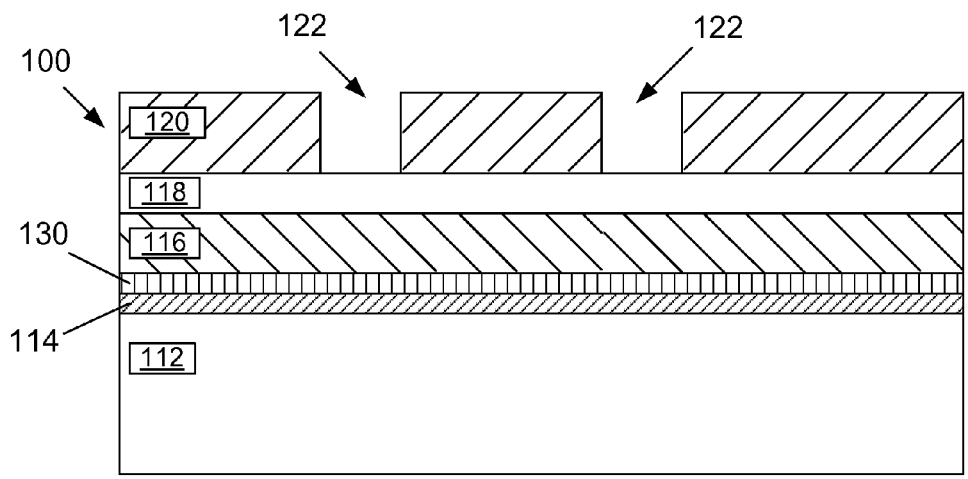
FIGS. 2A-2E depict various methods disclosed herein of forming a blanket protection layer to protect a metal hard mask layer.

FIG. 2A schematically illustrates a cross-sectional view of an integrated circuit product 100 at an advanced stage of manufacturing. The product 100 is formed above a substrate (not shown) that may have a variety of configurations, such as a bulk substrate configuration, an SOI (silicon-on-insulator) configuration, etc., and the substrate may be made of silicon or it may be made of materials other than silicon. Thus, the terms "substrate," "semiconductor substrate" or "semiconducting substrate" should be understood to cover all semiconducting materials and all forms of such materials.

With continuing reference to FIG. 2A, the product 100 is comprised of an illustrative layer of insulating material 112, a hard mask layer 114 comprised of a metal-containing alloy, a blanket (i.e., non-patterned) protection layer 130, an optical planarization layer 116, an ARC layer 118 and a patterned photoresist mask layer 120 having a plurality of openings 122 defined therein. The layers of material 112, 114, 116, 130 depicted in FIG. 2A may be formed by performing one of a variety of known processing techniques, such as a chemical vapor deposition (CVD) process, an atomic layer deposition (ALD) process, a physical vapor deposition (PVD) process, or plasma enhanced versions of such processes, and the thickness of such layers may vary depending upon the particular application. In some cases, one or more of the layers, e.g., the OPL layer 116, may be formed by performing a spincoating/curing process. The patterned layer of photoresist 120 may be formed using known photolithography tools and techniques.

The layer of insulating material 112 may be comprised of a variety of different materials, e.g., silicon dioxide, a layer of so-called low-k (k value less than about 3.3) insulating material, etc. In one particular embodiment, the hard mask layer 114 may be comprised of a metal, a metal-containing material or a metal alloy, e.g., titanium nitride, amorphous carbon, polysilicon, etc. The thickness of the hard mask layer 114 may also vary depending upon the particular application, e.g., 15-150 nm, based upon current-day technologies. The blanket protection layer 130 may be formed directly on the hard mask layer 114 and it may be comprised of a de-wetting material, such as, for example, silicon dioxide, silicon oxynitride, silicon nitride, etc. The thickness of the blanket protection layer 130 may also vary depending upon the particular application, e.g., 2-15 nm, based upon current-day technologies.

As will be recognized by those skilled in the art after a complete reading of the present applications, the layers 116, 118 and 120, considered collectively, constitute but one example of a masking layer that will be used in patterning at least the hard mask layer 114. Thus, the illustrative materials and arrangement of the layers 116, 118, and 120 should not be considered to be limiting as it relates to the novel invention disclosed herein. More specifically, the methods disclosed herein may be employed with any type or form of masking layer (that includes one or more patterned layers) formed above the blanket protection layer 130.

Figure 2B:
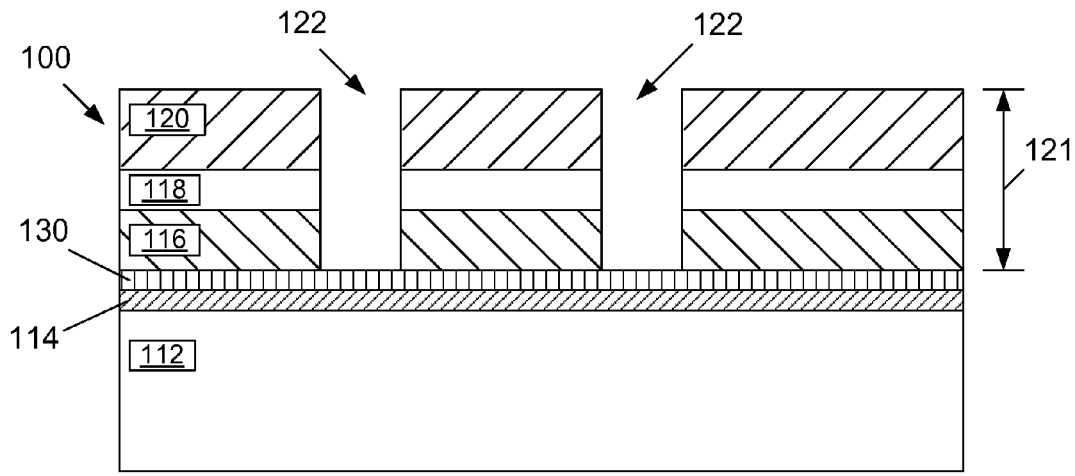

FIG. 2B depicts the product 100 after a plurality of etching processes have been performed that stops on the blanket (i.e., non-patterned) protection layer 130. In general, at this point, the patterned layers 116, 118 and 120 represent one embodiment of a patterned etch mask 121 that will be used to pattern the underlying hard mask layer 114. Note that, using the novel methods disclosed herein, the hard mask layer 114 is protected during the formation of the patterned etch mask 121 by the blanket protection layer 130.

After the patterned etch mask 121 is formed and the blanket protection layer 130 is exposed, the accuracy of the patterned etch mask 121 is checked. In the case where the patterned etch mask 121 is properly aligned, one or more etching processes may be performed through the patterned etch mask 121 to define openings (not shown in FIG. 2B) in the blanket protection layer 130, i.e., to pattern the blanket protection layer 130, and in the hard mask layer 114. As noted above in the background section of this application, in the event that the patterned etch mask 121 is misaligned, i.e., not correctly positioned in terms of the location of the openings 122 relative to various other underlying structures or markers on the product 100, the patterned etch mask 121 must be "reworked," i.e., it must be removed and the process must start all over again to form a properly positioned patterned etch mask 121.

Figure 2C:
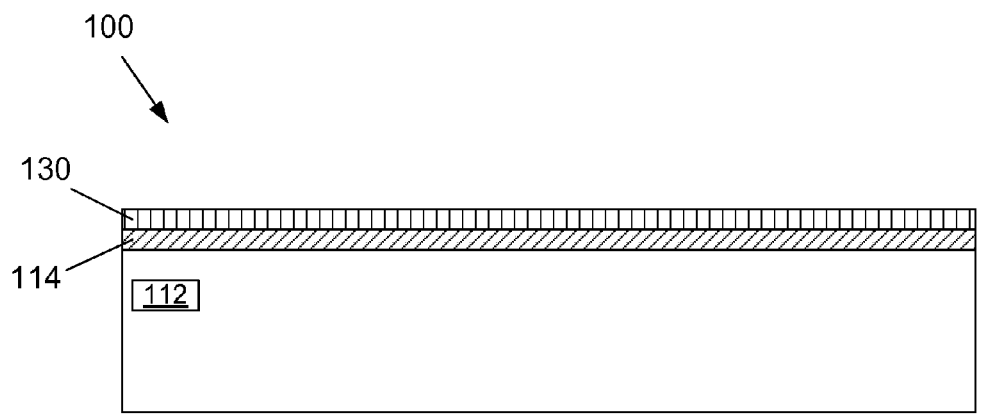

FIG. 2C depicts the product 100 after the illustrative patterned etch mask 121 shown in FIG. 2B has been removed. Note that, during the removal of the patterned etch mask 121, the blanket protection layer 130 covers the hard mask layer 114, i.e., the hard mask layer 114 is not exposed to the various process operations that are performed to remove the patterned etch mask 121. In the depicted example, removing the patterned etch mask 121 would typically involve (1) performing a plasma-based ashing process to remove the patterned photoresist mask layer 120; (2) performing a wet cleaning process using, for example, a dilute hydrofluoric acid (DHF) to strip the ARC layer 118; (3) performing another plasma-based process (using $N_2$ and $H_2$) to remove the OPL layer 116: and (4) performing a water rinse process in an attempt to remove residual materials from above the surface of the blanket protection layer 130. By selecting the material of the blanket protection layer 130 to be resistant to the removal/cleaning processes that may be performed when reworking the patterned etch mask 121, the blanket protection layer 130 can withstand such process operations and protect the underlying hard mask layer 114 from such process operations. Importantly, by use of the blanket protection layer 130, the defects 17 discussed in the background section of this application may be reduced or eliminated. The presence of the blanket protection layer 130, and the ability to increase its thickness, may allow a device manufacturer to perform reworking operations a greater number times than was possible when the hard mask layer was used without a blanket protection layer, as described in the background section of this application. After the patterned etch mask 121 is removed, the blanket protection layer 130 may remain in place as depicted in FIG. 2C.

Figure 2D:
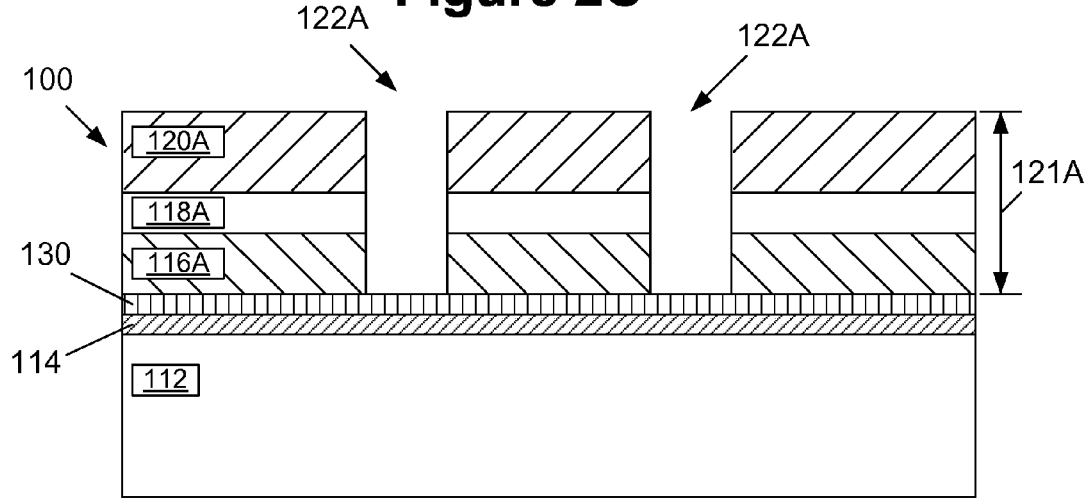

FIG. 2D depicts the device 100 after another or "reworked" patterned etch mask 121A has been formed above the blanket protection layer 130 and the hard mask layer 14. The reworked patterned etch mask 121A is comprised of an optical planarization layer 116A, an ARC layer 118A and a patterned photoresist mask layer 120A having a plurality of openings 122A defined therein. In this example, various inspection processes have been performed to confirm that the reworked patterned etch mask 121A has been formed such that it is correctly positioned on the product 100.

Figure 2E:
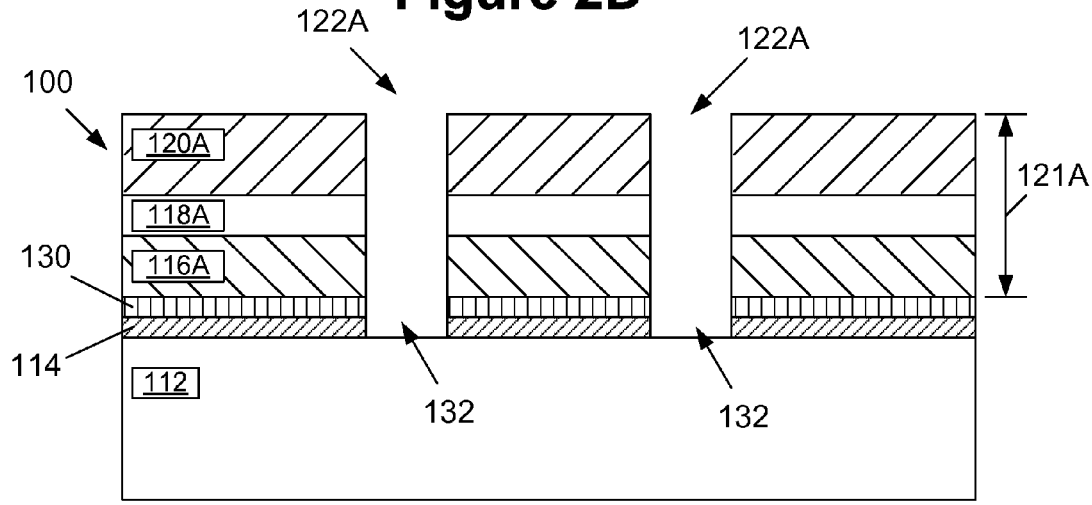

FIG. 2E depicts the product after one or more etching processes have been performed through the reworked patterned etch mask 121A to define illustrative openings 132 in the now-patterned protection layer 130 and the now-patterned hard mask layer 114. In practice, after the hard mask layer 114 is patterned, the reworked patterned etch mask 121A will be stripped and an opening or trench (not shown) will be formed in the layer of insulating material 112 by performing an etching process through the patterned hard mask layer 114. In some applications, the patterned protection layer 130 may be removed prior to etching the layer of insulating material 112, while in other applications the patterned protection layer 130 may remain in place while the layer of insulating material 112 is etched.

In current-day semiconductor manufacturing operations, devices designers are strongly encouraged to reduce the number of process steps required to manufacture a device and to reduce the time to manufacture a device. However, in this case, contrary to the mandate to reduce processing steps and time, the inventors have discovered that the formation of the protection layer 130 described above on the hard mask layer 114 provides significant benefits. That is, although the methods disclosed herein require the additional time and expense associated with forming the protection layer 130 and etching through the protection layer 130 as compared to the prior art process described in the background section of this application, the additional time and expense is justified in view of the problems reduced or solved by performing the methods disclosed herein. Moreover, using the methods disclosed herein, more accuracy in patterning features in the layer of insulating material may be achieved and/or the number of reworked patterned etch masks may be reduced. Typically, the type of defects caused by leaving particles behind on the surface will not be detected until the die is packaged; i.e., the wafer will have to go through all processes before a problem is detected. By adding this step, the expense incurred in producing dead wafers may be avoided.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a layer of insulating material above a semiconductor substrate;
   forming a hard mask layer above said layer of insulating material;
   forming a blanket protection layer on said hard mask layer;
   forming a masking layer above said blanket protection layer;
   performing at least one etching process on said masking layer to form a patterned masking layer having an opening that stops on and exposes an upper surface portion of said blanket protection layer without exposing said underlying hard mask layer;
   while said blanket protection layer is covering said hard mask layer, confirming that said patterned masking layer is properly positioned relative to at least one underlying structure or layer;
   after confirming that said patterned masking layer is properly positioned, performing at least one etching process through said patterned masking layer to pattern said blanket protection layer and said underlying hard mask layer, said patterned hard mask layer exposing an upper surface portion of said layer of insulating material;
   removing said patterned blanket protection layer, and
   after removing said patterned blanket protection layer, forming one of a trench and an opening in said layer of insulating material through said patterned hard mask layer.

2. The method of claim 1, wherein a lateral width of said one of said trench and said opening is defined by a lateral width of a first patterned opening formed in said patterned hard mask layer.

3. The method of claim 1, wherein said hard mask layer comprises one of a metal, a metal-containing material, a metal alloy, amorphous carbon, and polysilicon.

4. The method of claim 1, wherein said hard mask layer comprises titanium nitride.

5. The method of claim 1, wherein said hard mask layer has a thickness that falls within the range of about 15-150 nm.

6. The method of claim 1, wherein said blanket protection layer comprises one of a de-wetting material, silicon dioxide, silicon oxynitride, and silicon nitride.

7. The method of claim 1, wherein said blanket protection layer has a thickness that falls within the range of about 2-15 nm.

8. The method of claim 1, wherein forming said masking layer comprises forming an OPL layer on said blanket protection layer, forming an anti-reflective coating layer on said OPL layer, and forming a layer of photoresist material on said anti-reflective coating layer.

9. A method, comprising:
forming a layer of insulating material above a semiconductor substrate;
forming a hard mask layer above said layer of insulating material;
forming a blanket protection layer on said hard mask layer;
forming a first masking layer above said blanket protection layer;
performing at least one first etching process on said first masking layer to form a first patterned masking layer having a first opening that stops on and exposes a first upper surface portion of said blanket protection layer without exposing said underlying hard mask layer;
while said blanket protection layer is covering said hard mask layer, confirming that said first patterned masking layer is improperly positioned relative to at least one underlying structure or layer;
performing a masking layer removal process to remove said improperly positioned first patterned masking layer from above said blanket protection layer, said blanket protection layer protecting said hard mask layer from exposure to said masking layer removal process;
after removing said first patterned masking layer, forming a second masking layer above said blanket protection layer;
performing at least one second etching process on said second masking layer to form a second patterned masking layer having a second opening that stops on and exposes a second upper surface portion of said blanket protection layer without exposing said underlying hard mask layer;
while said blanket protection layer is covering said hard mask layer, confirming that said second patterned masking layer is properly positioned relative to at least one underlying structure or layer;
after confirming that said second patterned masking layer is properly positioned, performing at least one etching process through said second patterned masking layer to pattern said blanket protection layer and said hard mask layer, said patterned hard mask layer exposing an upper surface portion of said layer of insulating material;
removing said patterned blanket protection layer, and
after removing said patterned blanket protection layer, forming one of a trench and an opening in said layer of insulating material through said patterned hard mask layer.

10. The method of claim 9, wherein a lateral width of said one of said trench and said opening is defined by a lateral width of a first patterned opening formed in said patterned hard mask layer.

11. The method of claim 9, wherein said hard mask layer comprises one of a metal, a metal-containing material, a metal alloy, amorphous carbon, and polysilicon.

12. The method of claim 9, wherein said hard mask layer comprises titanium nitride.

13. The method of claim 9, wherein said hard mask layer has a thickness that falls within the range of about 15-150 nm.

14. The method of claim 9, wherein said blanket protection layer comprises one of a de-wetting material, silicon dioxide, silicon oxynitride, and silicon nitride.

15. The method of claim 9, wherein said blanket protection layer has a thickness that falls within the range of about 2-15 nm.

16. The method of claim 9, wherein forming each of said first and second masking layers comprises forming an OPL layer on said blanket protection layer, forming an anti-reflective coating layer on said OPL layer and forming a layer of photoresist material on said anti-reflective coating layer.

17. The method of claim 9, wherein a thickness of said blanket protection layer is approximately equal to or less than a thickness of said hard mask layer.

18. A method, comprising:
forming a layer of insulating material above a semiconductor substrate;
forming a hard mask layer above said layer of insulating material;
forming a blanket protection layer on said hard mask layer, wherein a thickness of said blanket protection layer falls within the range of about 2-15 nm;
forming a masking layer above said blanket protection layer;
performing at least one etching process on said masking layer to form a patterned masking layer having an opening that stops on and exposes an upper surface portion of said blanket protection layer without exposing said underlying hard mask layer;
while said blanket protection layer is covering said hard mask layer, confirming that said patterned masking layer is properly positioned relative to at least one underlying structure or layer; and
after confirming that said patterned masking layer is properly positioned, performing at least one etching process through said patterned masking layer to pattern said blanket protection layer and said underlying hard mask layer, said patterned hard mask layer exposing an upper surface portion of said layer of insulating material.

19. The method of claim 18, further comprising forming one of a trench and an opening in said layer of insulating material through at least said patterned hard mask layer, wherein a lateral width of said one of said trench and said opening is defined by a lateral width of a first patterned opening formed in said patterned hard mask layer.

20. The method of claim 19, wherein said one of said trench and said opening is formed in said layer of insulating material through said patterned blanket protection layer.

* * * * *